United States Patent
Kim et al.

(10) Patent No.: US 6,496,443 B2
(45) Date of Patent: Dec. 17, 2002

(54) DATA BUFFER CONTROL CIRCUITS, INTEGRATED CIRCUIT MEMORY DEVICES AND METHODS OF OPERATION THEREOF USING READ CYCLE INITIATED DATA BUFFER CLOCK SIGNALS

(75) Inventors: Byung-Chul Kim, Kyungki-do (KR); Seung Bum Ko, Kyungki-do (KR)

(73) Assignee: Samsung Electronics Co., Ltd. (KR)

(*) Notice: Subject to any disclaimer, the term of this patent is extended or adjusted under 35 U.S.C. 154(b) by 153 days.

(21) Appl. No.: 09/726,197

(22) Filed: Nov. 29, 2000

(65) Prior Publication Data
US 2001/0002181 A1 May 31, 2001

(30) Foreign Application Priority Data
Nov. 30, 1999 (KR) .............................. 99-53754

(51) Int. Cl.[7] ................................. G11C 8/00
(52) U.S. Cl. .................... 365/233; 365/189.05
(58) Field of Search .................... 365/233, 189.05, 365/233.5

(56) References Cited

U.S. PATENT DOCUMENTS 6,154,415 A * 11/2000 Jeong .................... 365/189.05

* cited by examiner

Primary Examiner—A. Zarabian
(74) Attorney, Agent, or Firm—Myers Bigel Sibley & Sajovec

(57) ABSTRACT

A data buffer control circuit provides a buffer clock signal to a data buffer of an integrated circuit memory device having a read cycle that is initiated by assertion of a read cycle control signal. A clock buffer circuit that receives an input clock signal and a clock buffer control signal, the clock buffer circuit operative to generate the buffer clock signal from the input clock signal when the clock buffer control signal is in a first state and to prevent generation of the buffer clock signal from the input clock signal when the clock buffer control signal is in a second state. A clock buffer control circuit is responsive to the read cycle control signal and to the clock signal and transitions the clock buffer control signal to the first state responsive to a first transition of the input clock signal following assertion of the read cycle control signal and that transitions the clock buffer control signal to the second state responsive to the end of the predetermined interval. A first half cycle of the input clock signal may commence with the first transition of the input clock signal, and the clock buffer control circuit may be operative to transition the clock buffer control signal to the first state following the first transition of the input clock signal and before the end of the first half cycle of the input clock signal.

25 Claims, 10 Drawing Sheets

DATA BUFFER CONTROL CIRCUITS, INTEGRATED CIRCUIT MEMORY DEVICES AND METHODS OF OPERATION THEREOF USING READ CYCLE INITIATED DATA BUFFER CLOCK SIGNALS

This application claims priority from Korean Application No. 1999-53754, filed Nov. 30, 1999, the disclosure of which is hereby incorporated herein by reference.

FIELD OF THE INVENTION

The present invention relates to integrated circuit devices and methods of operation thereof, and more particularly, to data buffer circuits, integrated circuit devices and methods of operation thereof.

BACKGROUND OF THE INVENTION

Conventional integrated circuit memory devices typically provide a read path that includes a sense amplifier, a data multiplexer, data buffer, and data output driver. In response to a data output control signal which acts like an intermittently enabled clock signal, a data buffer typically outputs data received from a sense amplifier via a data multiplexer. In some conventional integrated circuit memory devices, such a data output control signal is generated under control of a clock buffer control signal that enables and disables generation of the clock-like data output control signal. However, when the speed at which such an integrated circuit memory device is increased, timing of such a clock buffer control signal can be corrupted such that the data output control signal is improperly timed with respect to the operation of other devices in the read path.

SUMMARY OF THE INVENTION

According to embodiments of the present invention, a data buffer control circuit provides a buffer clock signal to a data buffer of an integrated circuit memory device having a read cycle that is initiated by assertion of a read cycle control signal. The data buffer control circuit comprises a clock buffer circuit that receives an input clock signal and a clock buffer control signal, the clock buffer circuit operative to generate the buffer clock signal from the input clock signal when the clock buffer control signal is in a first state and to prevent generation of the buffer clock signal from the input clock signal when the clock buffer control signal is in a second state. The data buffer control circuit further comprises a clock buffer control circuit that is responsive to the read cycle control signal and to the clock signal and that transitions the clock buffer control signal to the first state responsive to a first transition of the input clock signal following assertion of the read cycle control signal and that transitions the clock buffer control signal to the second state responsive to the end of the predetermined interval. A first half cycle of the input clock signal may commence with the first transition of the input clock signal, and the clock buffer control circuit may be operative to transition the clock buffer control signal to the first state following the first transition of the input clock signal and before the end of the first half cycle of the input clock signal.

According to some embodiments of the present invention, the clock buffer control circuit comprises a read cycle start detection circuit that receives the read cycle control signal and that generates a transition in a read cycle start detection signal responsive to the first transition of the input clock signal following the transition of the read cycle control signal. The clock buffer control circuit further comprises a latch circuit that receives the read cycle start detection signal and generates the first state in the clock buffer control signal responsive to the transition of the read cycle start detection signal.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 1:
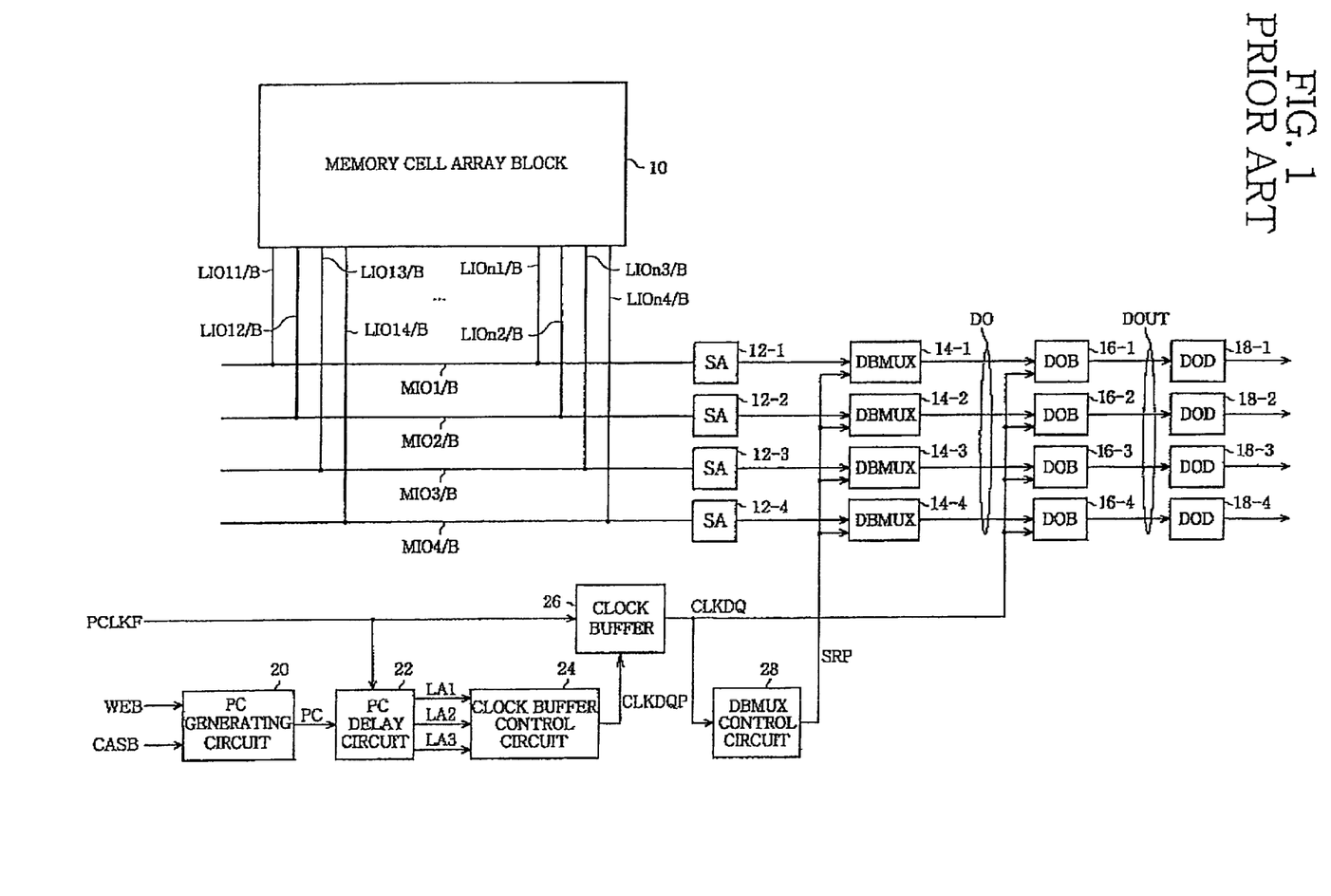
FIG. 1 is a schematic diagram illustrating an integrated circuit memory device according to the prior art.

FIG. 1 is a block diagram illustrating a conventional integrated circuit memory device. The conventional integrated circuit memory device comprises a memory cell 10, sense amplifiers 12-1, 12-2, 12-3, 12-4, multiplexers 14-1, 14-2, 14-3, 14-4, data buffers 16-1, 16-2, 16-3, 16-4, data output drivers 18-1, 18-2, 18-3, 18-4, a read signal generating circuit 20, a read signal delay circuit 22, a clock buffer control circuit 24, clock buffer 26, and a multiplexer control circuit 28.

A memory cell array 10 inputs and outputs data through n groups of local data input-output line pairs (LI011/B, LI012/B, LI013/B, LI014/B) through (LI0n1/B, LI0n2/B, LI0n3/B, LI0n4/B). N groups of local data input-output line pairs (LI011/B, LI012/B, LI013/B, LI014/B) through (LI0n1/B, LI0n2/B, LI0n3/B, LI0n4/B) are connected to main data input-output line pairs MI01/B, MI02/B, MI03/B, MI04/B. The memory cell array 10 of FIG. 1 comprises n memory cell array blocks (not shown). N blocks are connected to n groups of local data input-output line pairs (LI011/B, LI012/B, LI013/B, LI014/B) through (LI0n1/B, LI0n2/B, LI0n3/B, LI0n4/B), respectively.

A memory cell array 10 inputs and outputs data through n groups of local data input-output line pairs (LI011/B, LI012/B, LI013/B, LI014/B), . . . , (LI0n1/B, LI0n2/B, LI0n3/B, LI0n4/B). In a read operation, sense amplifiers 12-1, 12-2, 12-3 and 12-4 amplify and output data output through main data input output line pairs MI01/B, MI02/B, MI03/B, MI04/B. In a write operation, sense amplifiers 12-1, 12-2, 12-3 and 124 output to main data input output line pairs MI01/B, MI02/B, MI03/B, MI04/B by amplifying input data. The multiplexers 14-1, 14-2, 14-3, 14-4 output data outputted from sense amplifiers 12-1, 12-2, 12-3, 12-4 as data DO in response to a control signal SRP. The data buffers 16-1, 16-2, 16-3, 16-4 are enabled in response to a data output control signal CLKDQ, and buffer and output data DO outputted from multiplexers 14-1, 14-2, 14-3, 14-4 as data DOUT. The data output drivers 18-1, 18-2, 18-3, 184 output the data DOUT.

The read signal generating circuit 20 receives write enable and column address strobe signals WEB, CASB and generates a read signal PC. The read signal generating circuit 20 asserts the read signal PC in response to assertion of a column address strobe signal CASB to a logic "low" level when a write enable signal WEB is at a logic "high" level. The read signal delay circuit 22 generates a first latency interval indication signal LA1 that is delayed with respect to the read signal PC for a predetermined time in response to a clock signal PCLKF generated internally, generates a second latency interval indication signal LA2 that is delayed one cycle of the clock signal PCLK with respect to the first latency interval indication signal LA1, and generates a third latency interval indication signal LA3 that is delayed two periods of the clock signal PCLK with respect to the first latency interval indication signal LA1. The clock buffer control circuit 24 generates a clock buffer control signal CLKDQP that transitions to a logic "low" level when one of the first, second and third latency interval indication signals LA1, LA2, LA3 transitions to a logic "high" level, and that transitions to a logic "high" level when all of the first, second and third latency interval indication signals LA1, LA2, LA3 return to a logic "low" level. The clock buffer circuit 26 is enabled by the clock buffer control signal CLKDQP, and generates a buffer clock signal CLKDQ from the clock signal PCLKF when enabled. The multiplexer control circuit 28 receives the data output control signal CLKDQ and generates the multiplexer control signal SRP.

Figure 2:
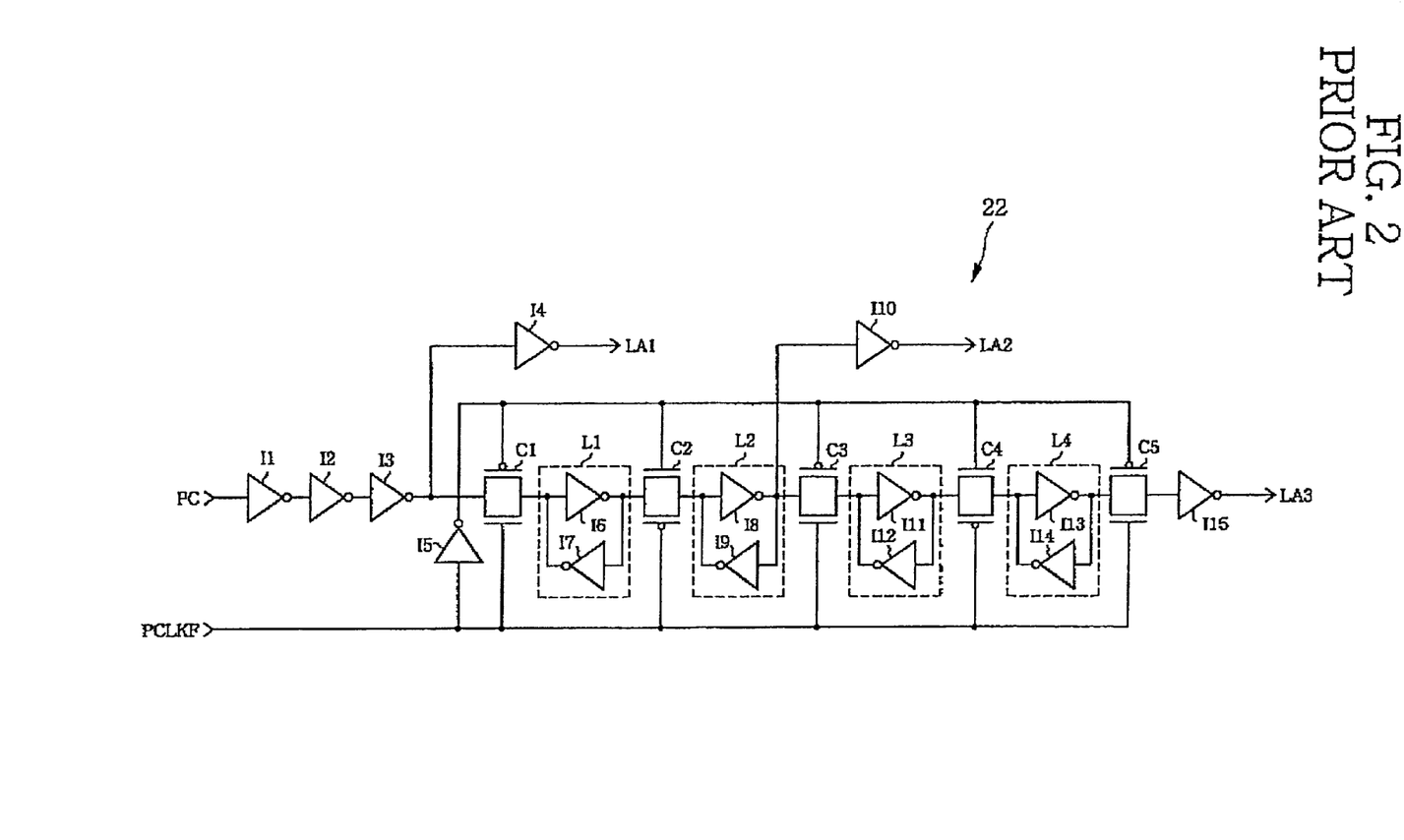
FIG. 2 is a schematic diagram illustrating a read signal delay circuit for the device of FIG. 1.

FIG. 2 illustrates the read signal delay circuit 22. The read signal delay circuit 22 includes inverters I1, I2,I3,I4,I5, I10, I15, CMOS transmission gates C1, C2, C3, C4, C5, and latches L1, L2, L3, L4. The latches L1, L2, L3, L4 include inverters I6 and I7, I8 and I9,I11 and I12, and I13 and I14, respectively. The inverters I1, I2, I3, I4 generate the first latency interval indication signal LA1 by delaying the read signal PC. The CMOS transmission gate C1 and latch L1 input, invert and latch an output signal of an inverter I3 in response to a transition to a logic "high" level in the clock signal PCLKF. The CMOS transmission gate C2 and latch L2 input, invert and latch an output signal of latch L1 in response to a transition to a logic "low" level in the clock signal PCLKF. The inverter I10 generates the second latency interval indication signal LA2 that is delayed for one period of the clock signal PCLK by inverting an output signal of the latch L2. The CMOS transmission gate C3 and latch L3 input, invert and latch an output signal of the latch L2 in response to transition to a logic "high" level in the clock signal PCLKF. The CMOS transmission gate C4 and latch L4 input, invert and latch an output signal of the latch L3 in response to a transition to a logic "low" level in the clock signal PCLKF. The CMOS transmission gate C5 is turned on in response to a transition to a logic "high" level in the clock signal PCLKF, and transmits an output signal of latch L4. The inverter I15 generates the third latency interval indication signal LA3 by inverting an output signal of the CMOS transmission gate C5. In sum, the circuit 22 of FIG. 2 generates the first signal LA1 by delaying the read signal PC by inverters I1, I2, I3 and I4, generates the second latency interval indication signal LA2 by delaying the first latency interval indication signal LA1 for one period of the clock signal PCLK, and generates the third latency interval indication signal LA3 by delaying the second latency interval indication signal LA2 for one period of the clock signal PCLK.

Figure 3:
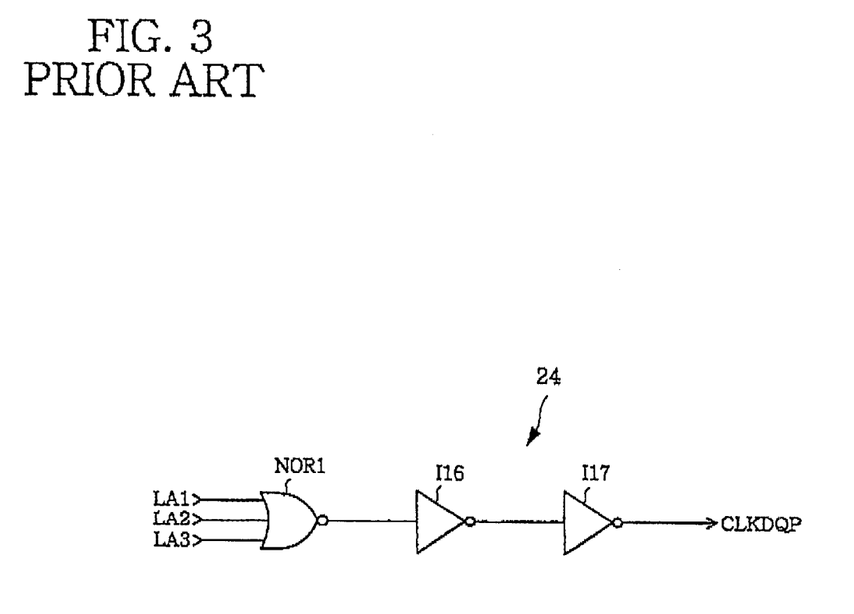
FIG. 3 is a schematic diagram illustrating a clock buffer control circuit for the device of FIG. 1.

FIG. 3 is a circuit diagram illustrating the clock buffer control circuit 24 of FIG. 1. The clock buffer circuit comprises a NOR gate NORI and inverters I16, I17. The clock buffer control circuit 24 generates the clock buffer control signal CLKDQP by NORing the first, second and third latency interval indication signals LA1, LA2, LA3. If all of the first, second and third latency interval indication signals LA1, LA2, LA3 are at a logic "low" level, a logic "high" level is generated in the clock buffer control signal CLKDQP. If one of the first, second and third latency interval indication signals LA1, LA2, LA3 goes to a logic "high" level, the clock buffer control signal CLKDQP goes to a logic "low" level.

Figure 4:
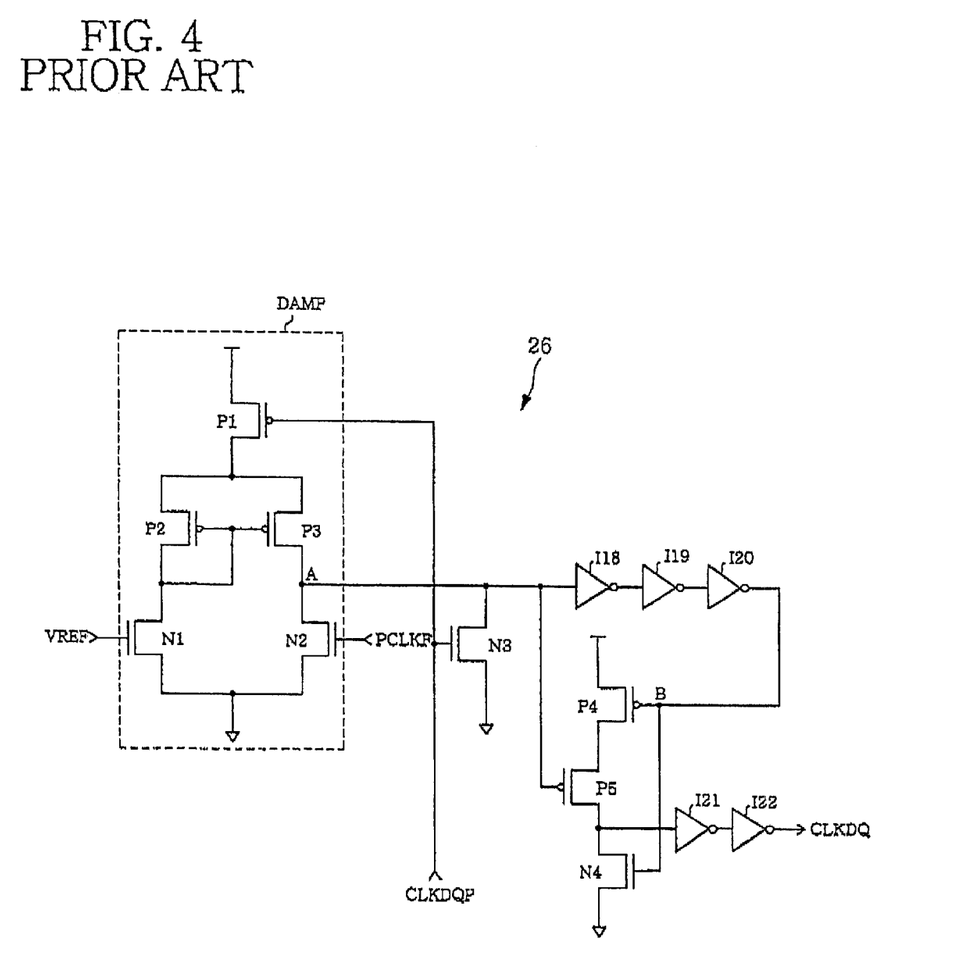
FIG. 4 is a schematic diagram illustrating a clock buffer circuit for the device of FIG. 1.

FIG. 4 is a circuit diagram illustrating the clock buffer circuit 26 of FIG. 1. The clock buffer circuit 26 includes a differential amplifier DAMP that includes PMOS transistors P1, P2, P3, NMOS transistors N1, N2, inverters I18, I19, I20, I21, I22, PMOS transistors P4, P5, and NMOS transistor N4. When the clock buffer control signal CLKDQP goes to a logic "high" level, a node A is reset to a logic "low" level by turning on the NMOS transistor N3. When the node A transitions to a logic "low" level, a node B transitions to a logic "high" level. In response, the buffer clock signal CLKDQ is driven to a logic "low" level by turning on the NMOS transistor N3.

When the clock buffer control signal CLKDQP transitions to a logic "low" level, the differential amplifier DAMP is enabled by turning on the PMOS transistor P1. The differential amplifier DAMP produces a logic "low" level at the node A by turning on the NMOS transistor N2 when the clock signal PCLKF has a logic "high" level, and produces a logic "high" level at the node A by turning on the NMOS transistor N1 when the clock signal PCLKF has a logic "low" level. In particular, if the reference voltage VREF applied to the differential amplifier DAMP is greater than the voltage of the clock signal PCLKF, the differential amplifier DAMP produces a logic "high" level at the node A and, if the voltage of the clock signal PCLKF is greater than the reference voltage VREF, the differential amplifier DAMP produces a logic "low" level at the node A. The signal at the node A is output to the node B by being inverted and delayed through inverters I18, I19 and I20. If the signal at the node A transitions to a logic "high" level, the signal at the node B transitions to a logic "low" level after a predetermined delay.

When the signal at the node B transitions to a logic "low" level, the drain of the PMOS transistor P4 is precharged by turning on the PMOS transistor P4 and turning off the NMOS transistor N3. Subsequently, after the node A transitions to a logic "low" level, the precharge at the drain of the PMOS transistor P4 is output to the drain of the PMOS transistor P5 by turning on the PMOS transistor P5. In response, the inverters I21, I22 generate a logic "high" level in the buffer clock signal CLKDQ. When the signal at the node A transitions to a logic "low" level, the signal at the node B transitions to a logic "high" level after a predetermined delay. Subsequently, a logic "low" level signal is produced at the drain of the NMOS transistor N3 by turning on the NMOS transistor N3. In response, the inverters I21, I22 generate a logic "low" level in the buffer clock signal CLKDQ. As shown in FIG. 3, the conventional clock buffer control circuit 24 operates responsive to the first, second and third latency interval indication signals LA1, LA2, LA3. Generation of clock buffer control signal CLKDQP can be affected when the frequency of the clock signal PCLKF increases.

Figure 5:
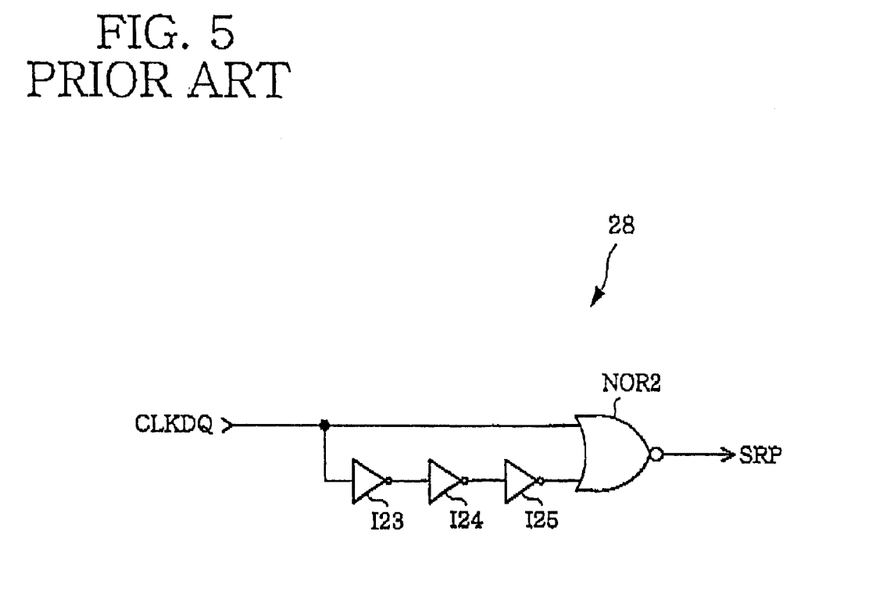
FIG. 5 is a schematic diagram illustrating a multiplexer control circuit for the device of FIG. 1.

FIG. 5 is a circuit diagram illustrating the multiplexer control circuit 28 of FIG. 1. The multiplexer control circuit 28 comprises inverters I23, I24, I24 and a NOR gate NOR2. The inverters I23, I24, I25 invert and delay the data output control signal CLKDQ. The NOR gate NOR2 drives the multiplexer control signal SRP to a logic "high" level in response to the data output control signal CLKDQ transitioning to a logic "low" level.

Figure 6:
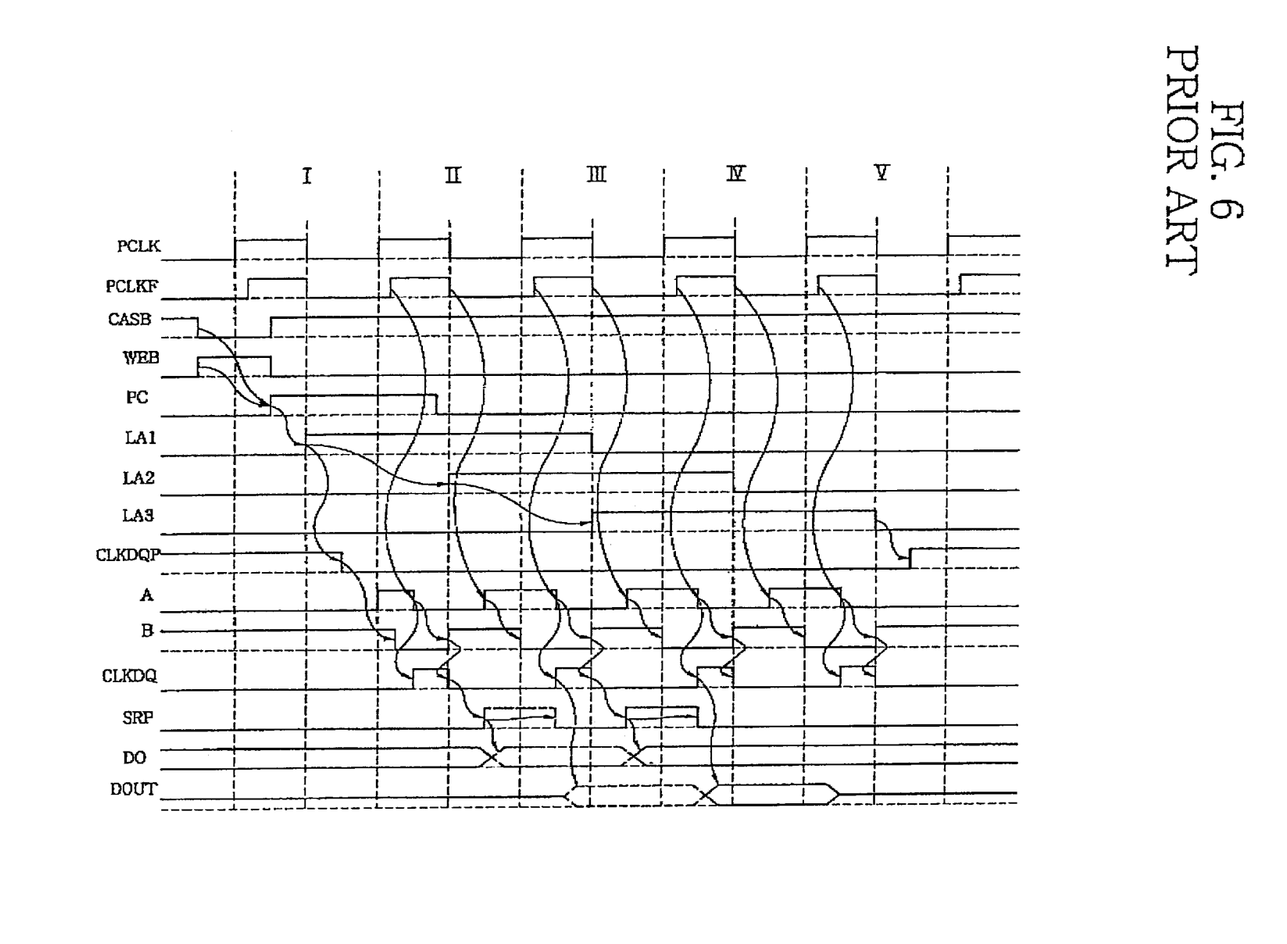
FIG. 6 is a timing diagram illustrating operations of the device of FIG. 1.

FIG. 6 is a timing diagram illustrating read cycle operations of the conventional integrated circuit memory device of in FIG. 1, with a column address strobe (CAS) latency of 3 and a burst length of 2. The CAS latency of 3 means data is output in a third cycle III of the read cycle following initiation of the read cycle in a first cycle I. The burst length of 2 means that two addresses are generated sequentially and data corresponding to two addresses are generated sequentially.

The clock signal PCLKF is generated by buffering an externally applied clock signal. In the first interval I, in response to the clock signal PCLKF transitioning to a logic "high" level when a column address strobe signal CASB is at a "low" level and a write enable signal WEB is at a "high" level, a logic "high" level is generated the read signal PC. In the first interval I, the first latency interval indication signal LA1 is generated by delaying the read signal PC. In a second interval II, the second latency interval indication signal LA2 is generated by delaying the first latency interval indication signal LA1 for one period of the clock signal PCLKF. In a third interval III, the third latency interval indication signal LA3 is generated by delaying the second latency interval indication signal LA2 for one period of the clock signal PCLKF.

In the first interval I, the clock buffer control signal CLKDQP transitions to a logic "low" level upon a transition of the clock signal PCLKF to a logic "low" level when the first latency interval indication signal LA1 is at a logic "high" level. In a fifth interval V, the clock buffer control signal CLKDQP transitions to a logic "high" in response to all of the first, second and third latency interval indication signals LA1, LA2, LA3 all transitioning back to a logic "low" level. The clock buffer control signal CLKDQP is transited to "low" level at "low" level of a clock signal PCLK during the first interval I.

In the second interval II, the node A of the clock buffer circuit 26 transitions to a logic "high" level in response to clock signal PCLKF. Soon thereafter, the node B of the clock buffer circuit 26 transitions to a logic "low" level. If node A transitions to a logic "low" level before node B transitions to a logic "low" level, the multiplexer control signal SRP may not be generated, which can prevent valid data from being presented to the data buffers 16-1, 16-2, 16-3, 16-4. This may corrupt generation of the output signals DO produced by the multiplexers 14-1, 14-2, 14-3, 14-4, which can result in a read data loss.

Figure 7:
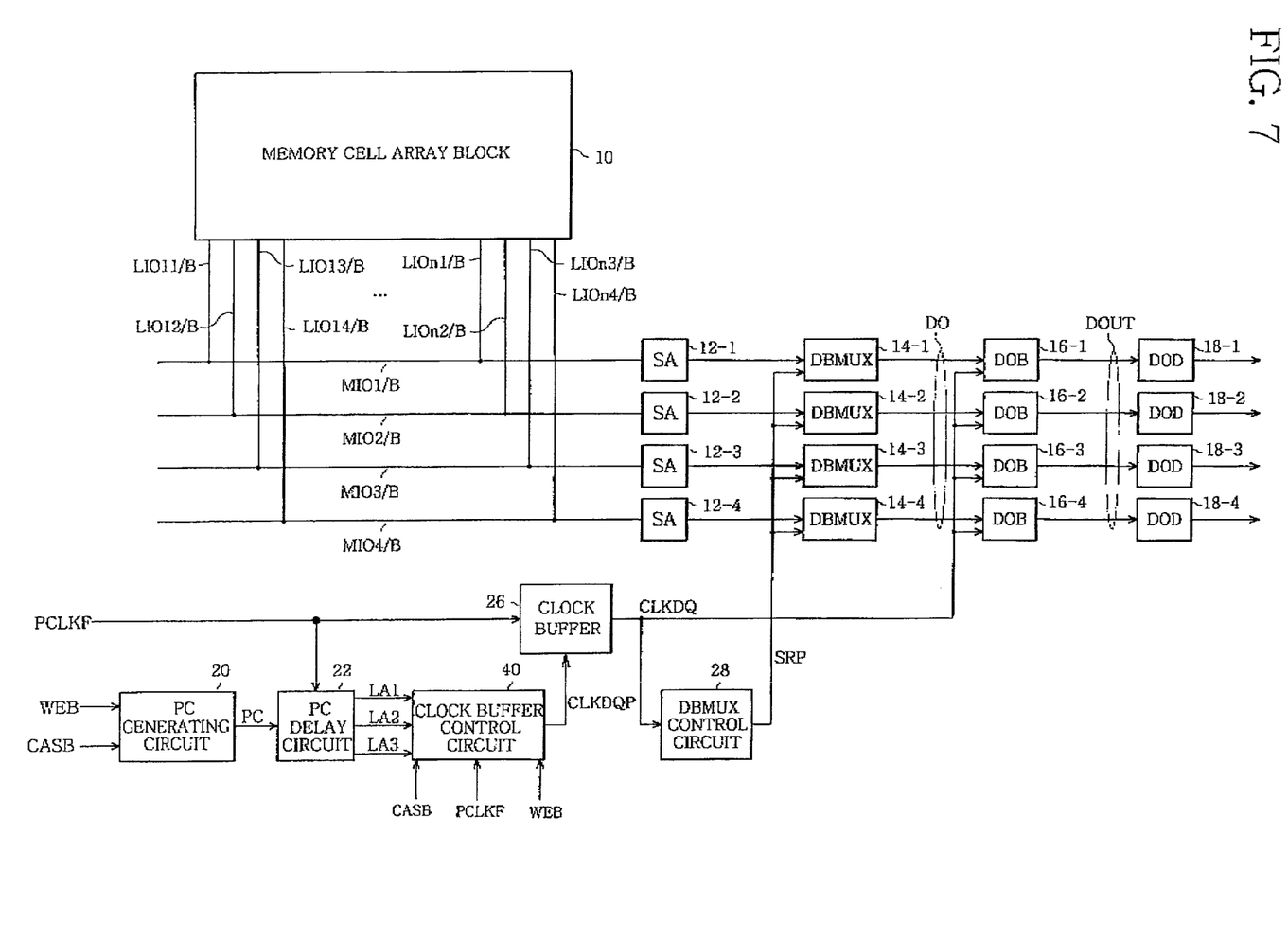
FIG. 7 is a schematic diagram illustrating an integrated circuit memory device according to embodiments of the present invention.

FIG. 7 illustrates an integrated circuit memory device 700 according to embodiments of the present invention. The integrated circuit memory device 700 includes several components found in the conventional integrated circuit memory device illustrated in FIG. 1, with like components of FIGS. 1 and 7 being indicated by like reference numerals. Description of these like components will be omitted in light of the foregoing description of these components with reference to FIGS. 1–5.

The integrated circuit memory device 700 of FIG. 7 differs from the device of FIG. 1 in that it includes a clock buffer control circuit 40 that generates a clock buffer control signal CLKDQP' responsive to the first, second and third latency interval indication signals LA1, LA2, LA3, to the clock signal PCLKF, and to the column address strobe signal CASB and the write enable signal WEB that initiate the read cycle of the integrated circuit device 700.

Figure 8:
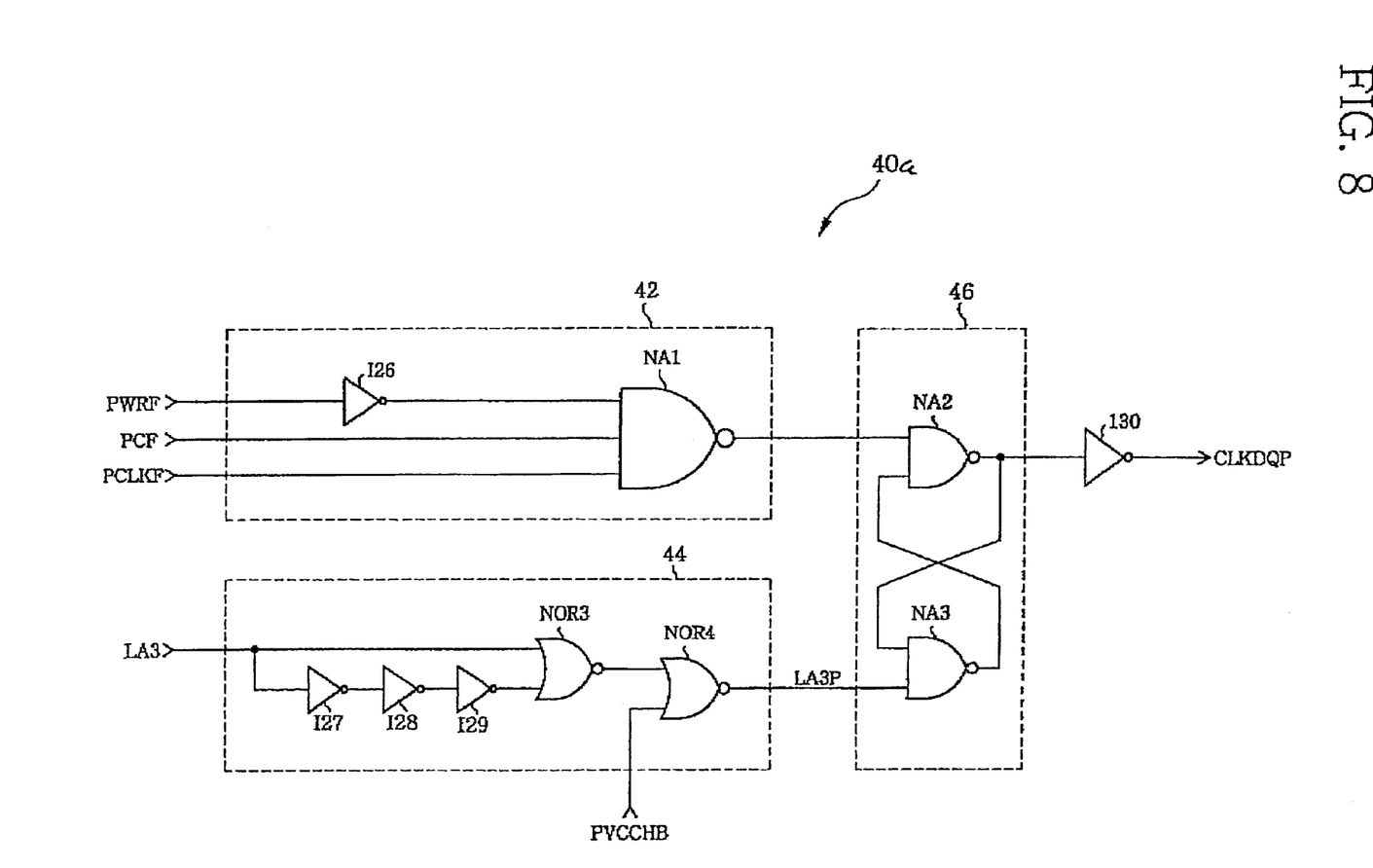
FIGS. 8 and 9 are schematic diagrams illustrating portions of a clock buffer control circuit according to embodiments of the present invention.
Figure 9:
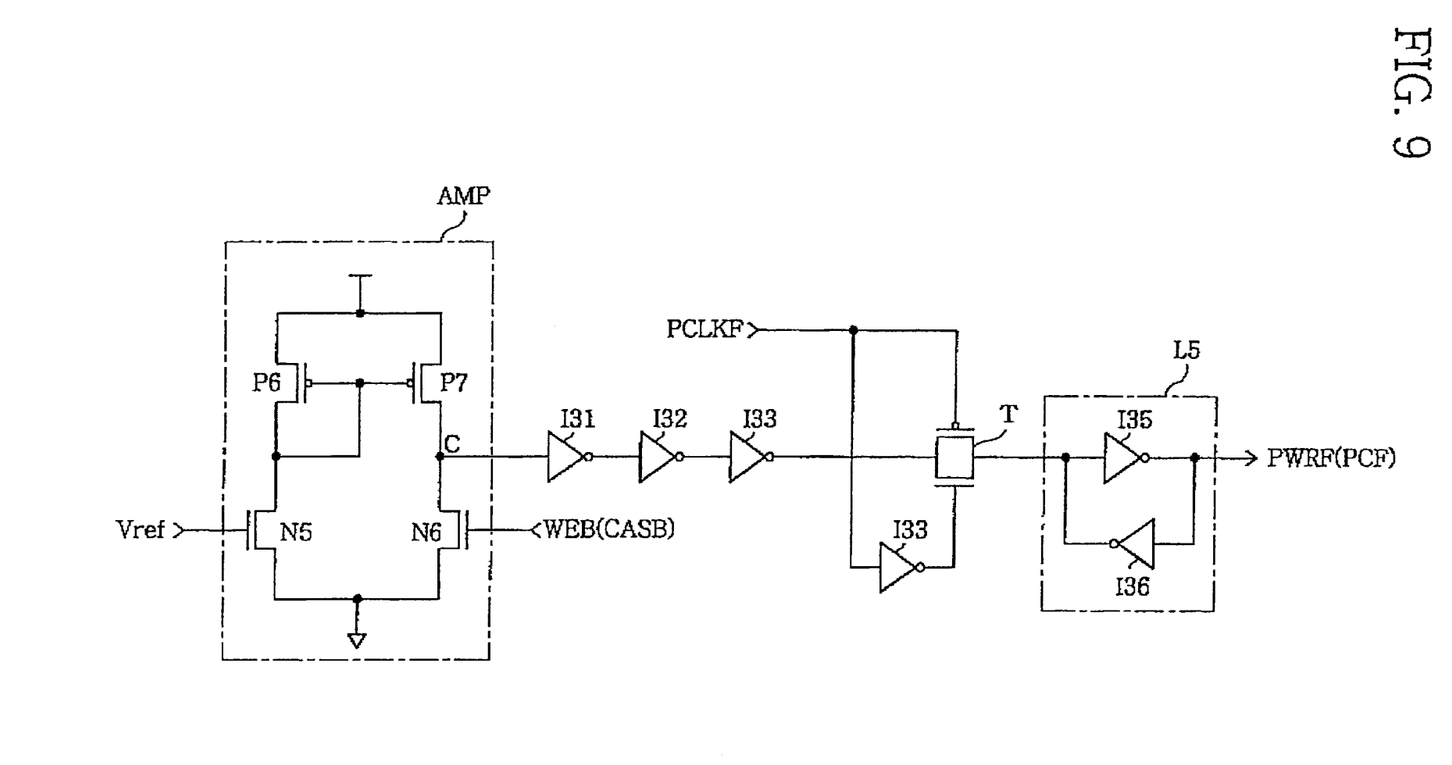

FIGS. 8 and 9 illustrate portions 40a, 40b of a clock buffer control circuit 40 according to embodiments of the present invention. Referring to FIG. 8, the circuit portion 40a includes a read cycle start detection circuit 42 that includes an inverter I26 and a NAND gate NA1. The circuit portion 40a also includes a read cycle end detection circuit 44 that includes inverters I27, I28, I29, NOR gates NOR3, NOR4, a latch 46 including NAND gates NA2, NA3, and an inverter I30.

The read cycle start detection circuit 42 generates a logic "low" output signal when a signal PWRF has a logic "low" level and signals PCF and PCLKF have a logic "high" level, i.e., when a read cycle is initiated as described below with reference to FIG. 9. In particular, the inverter I26 inverts the signal PWRF. The NAND gate NA1 NANDs the output signal of the inverter I26 and the signals PCF and PCLKF.

The read cycle end detection circuit 44 generates a signal LA3P responsive to the third latency interval indication signal LA3. The inverters I27, I28, I29 and the NOR gate NOR3 generates logic "high" level signal for a predetermined time when the third latency interval indication signal LA3 transitions from a logic "low" level to a logic "high" level. The NOR gate NOR4 inverts this signal to produce the signal LA3P when a reset signal PVCCHB is at a logic "low" level.

The latch 46 generates a logic "high" output signal in response to a logic "low" level produced by the read cycle start detection circuit 42, and latches a logic "high" level in response to output signal of the read cycle end detection circuit 44 having a logic "low" level. The inverter I30 inverts the output of the latch 46 to generate the clock buffer control signal CLKDQP'.

FIG. 9 illustrates a circuit portion 40b, which can be used to generate the signals PWRF, PCF. The circuit portion 40b includes a differential amplifier AMP including PMOS transistors P6, P7, NMOS transistors N5, N6, inverters I31, I32, I33, I34, a CMOS transmission gate T, and a latch L5 including inverters I35, I36. When the write enable signal WEB (or the column address strobe signal CASB) has a logic "high" level, i.e., higher than a reference voltage Vref, the NMOS transistor N6 turns on, causing the node C to be driven to a logic "low" level. When the write enable signal WEB (or the column address strobe signal CASB) has a logic "low" level, the NMOS transistor N5 and the PMOS transistors P6, P7 are turned on, so that the differential amplifier AMP drives the node C to a logic "high" level. The inverters I31, I32, I33 buffer and invert the signal at the node C and applies the result to the CMOS transmission gate T. The transmission gate T transmits an output signal of the inverter I33 in response to a logic "low" level in the clock signal PCLKF. The latch L5 generates the signal PWRF (or the signal PCF) by latching and inverting the signal from the CMOS transmission gate T.

Figure 10:
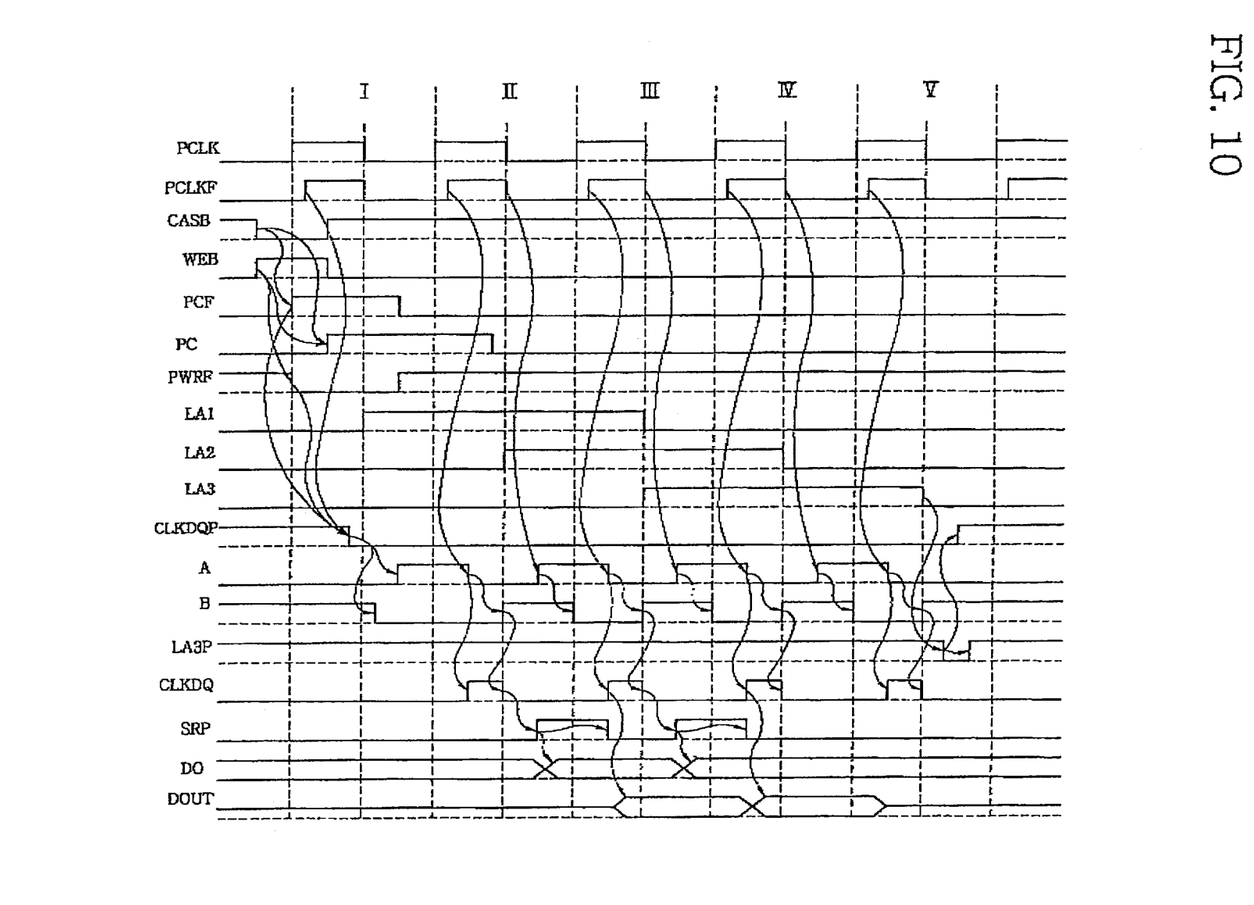
FIG. 10 is a timing diagram illustrating exemplary operations of an integrated circuit memory device according to embodiments of the present invention.

FIG. 10 is a timing diagram illustrating exemplary operations of the integrated circuit device 700 of FIG. 7 according to embodiments of the present invention, for a case in which column address strobe latency is 3 and burst length is 2. In a first interval I, in response to transistion of the clock signal PCLK to a logic "high" level when the column address strobe signal CASB is at a logic "low" level and the write enable signal WEB is at a logic "high" level, the signals PCF, PWRF are asserted to a logic "high" and a logic "low", respectively. Responsive to transition of the clock signal PCLKF to a logic "high" level when the signals PWRF, PCF are at logic "low" and logic "high" levels, respectively, the clock buffer control signal CLKDQP' transitions to a logic "low" level. This enables generation of the buffer clock signal CLKDQ' from the clock signal PCLKF sooner in the read cycle than occurs with the buffer clock signal CLKDQ in the conventional operations illustrated in FIG. 6. In turn, the multiplexer control signal SRP' is generated earlier in the read cycle than the multiplexer control signal SRP in the conventional operations illustrated in FIG. 6.

For the remaining portion of the first interval I and into the fifth interval V, the node A of the clock buffer circuit 26 is responsive to transitions of the clock signal PCLKF. The multiplexer control signal SRP' is generated responsive to the buffer clock signal CLKDQ'. First and second bursts of output signals DO are sequentially produced by the multiplexers 14-1, 14-2, 14-3, 14-4 responsive to successive positive edges of the multiplexer control signal SRP'. Corresponding first and second bursts of data output signals DOUT are produced by the data buffers 16-1, 16-2, 16-3, 16-4 responsive to successive positive edges of the buffer clock signal CLKDQ'. In the fifth interval V, the signal LA3P transitions to a logic "low" level responsive to a transition of the third latency interval indication signal LA3 to a logic "low" level. In turn, the clock buffer control signal CLKDQP' transitions to a logic "high" level, disabling generation of the buffer clock signal CLKDQ' from the clock signal PCLKF.

As described above, a clock buffer control circuit of an integrated circuit memory device according to embodiments of the present invention can avoid read errors at high clock frequencies by enabling generation of a buffer clock signal CLKDQ' that controls a data buffer earlier in the read cycle. This can allow a multiplexer control signal SRP' applied to a multiplexer that feeds the data buffer to be generated sufficiently early to present valid data to the data buffer.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A data buffer control circuit for providing a buffer clock signal to a data buffer of an integrated circuit memory device having a read cycle that is initiated by assertion of a read cycle control signal, the data buffer control circuit comprising:

a clock buffer circuit that receives an input clock signal and a clock buffer control signal, the clock buffer circuit operative to generate the buffer clock signal from the input clock signal when the clock buffer control signal is in a first state and to prevent generation of the buffer clock signal from the input clock signal when the clock buffer control signal is in a second state; and clock buffer control circuit that is responsive to the read cycle control signal and to the clock signal and that transitions the clock buffer control signal to the first state responsive to a first transition of the input clock signal following assertion of the read cycle control signal and that transitions the clock buffer control signal to the second state responsive to the end of a predetermined interval.

2. The data buffer control circuit of claim 1, wherein a first cycle of the input clock signal commences with the first transition of the input clock signal, and wherein the clock buffer control circuit transitions the clock buffer control signal to the first state following the first transition of the input clock signal and before the end of the first cycle of the input clock signal.

3. The data buffer control circuit of claim 1, wherein the clock buffer control circuit comprises:

a read cycle start detection circuit that receives the read cycle control signal and that generates a transition in a read cycle start detection signal responsive to the first transition of the input clock signal following the transition of the read cycle control signal; and a latch circuit that receives the read cycle start detection signal and generates the first state in the clock buffer control signal responsive to the transition of the read cycle start detection signal.

4. The data buffer control circuit of claim 3, wherein the integrated circuit memory device generates a transition in a latency interval indication signal that indicates the end of the predetermined interval, wherein the clock buffer control circuit further comprises a read cycle end detection circuit that generates a transition in a read cycle end detection signal responsive to the transition of the latency interval indication signal, and wherein the latch circuit generates the second state in the clock buffer control signal responsive to the transition of the read cycle end detection signal.

5. The data buffer control circuit of claim 1, wherein the integrated circuit memory device initiates the read cycle responsive to a concurrent assertion of a column address strobe signal and deassertion of a write enable signal, and wherein clock buffer control circuit transitions the clock buffer control signal to the first state responsive to a first transition of the input clock signal following concurrent assertion of the column address strobe signal and deassertion of the write enable signal.

6. The data buffer control circuit of claim 1, wherein the integrated circuit memory device comprises a multiplexer that provides data to the data buffer responsive to a multiplexer control signal that is generated responsive to the buffer clock signal.

7. A data buffer control circuit device according to claim 6, wherein the clock buffer control circuit is operative to enable generation of the buffer clock signal during the read cycle such that a first data burst of the read cycle produced by the data buffer in response to a transition in the buffer clock signal is preceded by a transition of the buffer clock signal that causes the multiplexer control circuit to assert the multiplexer control signal.

8. An integrated circuit memory device, comprising:

a memory unit including a plurality of memory cells and interface circuitry that generates data signals corresponding to data stored in the memory cells responsive to a read cycle control signal;

a data buffer that receives the data signals and latches the data signals responsive to a buffer clock signal;

a clock buffer circuit that receives an input clock signal and a clock buffer control signal, the clock buffer circuit operative to generate the buffer clock signal from the input clock signal when the clock buffer control signal is in a first state and to prevent generation of the buffer clock signal from the input clock signal when the clock buffer control signal is in a second state; and a clock buffer control circuit that is responsive to the read cycle control signal and to the clock signal and that transitions the clock buffer control signal to the first state responsive to a first transition of the input clock signal following assertion of the read cycle control signal and that transitions the clock buffer control signal to the second state responsive to the end of a predetermined interval.

9. The integrated circuit memory device of claim 8, wherein a first cycle of the input clock signal commences with the first transition of the input clock signal, and wherein the clock buffer control circuit transitions the clock buffer control signal to the first state following the first transition of the input clock signal and before the end of the first cycle of the input clock signal.

10. The integrated circuit memory device of claim 8, wherein the clock buffer control circuit comprises:
a read cycle start detection circuit that receives the read cycle control signal and that generates a transition in a read cycle start detection signal responsive to the first transition of the input clock signal following the transition of the read cycle control signal; and
a latch circuit that receives the read cycle start detection signal and generates the first state in the clock buffer control signal responsive to the transition of the read cycle start detection signal.

11. The integrated circuit memory device of claim 10, wherein the integrated circuit memory device generates a transition in a latency interval indication signal that indicates the end of the predetermined interval, wherein the clock buffer control circuit further comprises a read cycle end detection circuit that generates a transition in a read cycle end detection signal responsive to the transition of the latency interval indication signal, and wherein the latch circuit generates the second state in the clock buffer control signal responsive to the transition of the read cycle end detection signal.

12. The integrated circuit memory device of claim 8, wherein the integrated circuit memory device initiates the read cycle responsive to a concurrent assertion of a column address strobe signal and deassertion of a write enable signal, and wherein clock buffer control circuit transitions the clock buffer control signal to the first state responsive to a first transition of the input clock signal following concurrent assertion of the column address strobe signal and deassertion of the write enable signal.

13. The integrated circuit memory device of claim 8, wherein the interface circuitry includes a multiplexer that provides data to the data buffer responsive to a multiplexer control signal, and wherein the integrated circuit memory device further comprises a multiplexer control circuit that generates the multiplexer control signal responsive to the buffer clock signal.

14. The integrated circuit memory device of claim 13, wherein the clock buffer control circuit is operative to enable generation of the buffer clock signal during the read cycle such that a first data burst of the read cycle produced by the data buffer in response to a transition in the buffer clock signal is preceded by a transition of the buffer clock signal that causes the multiplexer control circuit to assert the multiplexer control signal.

15. An integrated circuit memory device, comprising:
a clock buffer control circuit that enables a clock buffer control signal by detecting a read command when the read command is applied, and disabling the clock buffer control signal by detecting end of the read command; and
a clock buffer circuit that generates a buffer clock signal applied to a data buffer in response to a clock signal when the clock buffer control signal is enabled.

16. The integrated circuit memory device of claim 15, wherein the clock buffer control circuit comprises:
a read cycle start detection circuit that generates a read cycle start signal;
a read cycle end detection circuit that generates a read cycle end signal;
a latch that enables the clock buffer control signal by latching the read cycle start signal and disables the clock buffer control signal when the read cycle end signal is generated.

17. The integrated circuit memory device of claim 15, wherein the clock buffer circuit comprises: a differential amplifier that produces a first signal from a clock signal when the clock buffer control signal is enabled;
a delay circuit that generates second signal by delaying for a predetermined time and inverting the first signal;
a control signal generating circuit which is precharged in response to the second signal and that generates the precharged level in response to the first signal as the buffer clock signal.

18. An integrated circuit memory device comprising:
a memory cell array;
a plurality of sense amplifiers that amplify and output data from the memory cell array when a read command is applied;
a plurality of data output buffers that output data received from the plurality of sense amplifiers in response to a buffer clock signal;
a clock buffer control circuit that enables a clock buffer control signal by detecting the read command when the read command is applied and that disables the clock buffer control signal by detecting when the read command is ended; and
a clock buffer that generates the buffer clock signal in response to a clock signal when the clock buffer control signal is enabled.

19. The integrated circuit memory device of claim 18, wherein the clock buffer control circuit comprises:
a read cycle start detection circuit that generates a read cycle start signal;
a read cycle end detection circuit that generates a read cycle end signal; and
a latch that enables the clock buffer control signal by latching the read cycle start signal and disables the clock buffer control signal when the read cycle end signal is generated.

20. The integrated circuit memory device of claim 18, wherein the clock buffer circuit comprises: a differential amplifier that produces a first signal from a clock signal when the clock buffer control signal is enabled;
a delay circuit that generates second signal by delaying for a predetermined time and inverting the first signal; and
a control signal generating circuit which is precharged in response to the second signal and that generates the precharged level in response to the first signal as the buffer clock signal.

21. The integrated circuit memory device of claim 18, further comprising:

a plurality of multiplexers that output data from the plurality of sense amplifiers to the plurality of data buffers in response to multiplexer control signal; and a multiplexer control circuit that generates the multiplexer control signal in response to the buffer clock signal.

22. A method of operating an integrated circuit memory device that includes a memory unit including a plurality of memory cells and interface circuitry that generates data signals corresponding to data stored in the memory cells responsive to a read cycle control signal and a data buffer that receives the data signals and latches the data signals responsive to a buffer clock signal, the method comprising:

transitioning a clock buffer control signal to a first state responsive to a first transition of an input clock signal following assertion of the read cycle control signal;

generating the buffer clock signal from the input clock signal when the clock buffer control signal is in the first state to cause the data buffer to latch data signals received from the interface circuitry;

transitioning the clock buffer control signal to the second state responsive to the end of a predetermined interval; and preventing generation of the buffer clock signal from the input clock signal when the clock buffer control signal is in the second state.

23. The method of claim 22, wherein a first half cycle of the input clock signal commences with the first transition of the input clock signal, and wherein the clock buffer control signal transitions to the first state following the first transition of the input clock signal and before the end of the first half cycle of the input clock signal.

24. The method of claim 22, wherein the interface circuitry includes a multiplexer that provides data to the data buffer responsive to a multiplexer control signal, and wherein the method further comprises generating the multiplexer control signal responsive to the buffer clock signal.

25. A method of reading data from an integrated circuit memory device including a data buffer that receives data from a sense amplifier, the method comprising:

enabling a clock buffer control signal by detecting a read command when the read command is entered;

generating a buffer clock signal from a clock signal when the clock buffer control signal is enabled;

outputting data from the data buffer in response to the buffer clock signal; and disabling the clock buffer control signal by detecting when the read command is ended.

* * * * *